United States Patent
Gerber et al.

(10) Patent No.: US 7,569,918 B2
(45) Date of Patent: Aug. 4, 2009

(54) SEMICONDUCTOR PACKAGE-ON-PACKAGE SYSTEM INCLUDING INTEGRATED PASSIVE COMPONENTS

(75) Inventors: Mark A. Gerber, Lucas, TX (US); Kurt P. Wachtler, Richardson, TX (US); Abram M. Castro, Fort Worth, TX (US)

(73) Assignee: Texas Instruments Incorporated, Dallas, TX (US)

( * ) Notice: Subject to any disclaimer, the term of this patent is extended or adjusted under 35 U.S.C. 154(b) by 394 days.

(21) Appl. No.: 11/380,953

(22) Filed: May 1, 2006

(65) Prior Publication Data

US 2007/0254404 A1    Nov. 1, 2007

(51) Int. Cl.
*H01L 23/02* (2006.01)
(52) U.S. Cl. .................. 257/676; 257/724; 438/107
(58) Field of Classification Search ........... 257/686, 257/723, 724, 778, 777; 438/107, 108, 109
See application file for complete search history.

(56) References Cited

U.S. PATENT DOCUMENTS

| | | | |
|---|---|---|---|
| 6,297,550 B1 * | 10/2001 | Chia et al. ............ 257/707 |
| 6,297,551 B1 * | 10/2001 | Dudderar et al. ......... 257/723 |
| 6,489,686 B2 * | 12/2002 | Farooq et al. ........... 257/777 |
| 6,734,539 B2 * | 5/2004 | Degani et al. ........... 257/686 |
| 7,034,387 B2 * | 4/2006 | Karnezos ............... 257/686 |
| 7,154,175 B2 * | 12/2006 | Shrivastava et al. ...... 257/723 |
| 7,160,757 B2 * | 1/2007 | Narkhede et al. ........ 438/117 |
| 7,242,081 B1 * | 7/2007 | Lee ..................... 257/686 |
| 2003/0075811 A1 * | 4/2003 | Cohn et al. ............. 257/777 |
| 2007/0158856 A1 * | 7/2007 | Narkhede et al. ........ 257/778 |
| 2007/0235865 A1 * | 10/2007 | Bauer et al. ............ 257/723 |

* cited by examiner

*Primary Examiner*—S. V Clark
(74) *Attorney, Agent, or Firm*—Yingsheng Tung; Wade James Brady, III; Frederick J. Telecky, Jr.

(57) ABSTRACT

A semiconductor system (300) has one or more packaged active subsystems (310, 330); each subsystem has a substrate with electrical contact pads and one or more semiconductor chips stacked on top of each other, assembled on the substrate. The system further has a packaged passive subsystem (320) including a substrate with electrical contacts and passive electrical components, such as resistors, capacitors, and indictors. The passive subsystem is stacked with the active subsystems and connected to them by solder bodies.

16 Claims, 5 Drawing Sheets

SEMICONDUCTOR PACKAGE-ON-PACKAGE SYSTEM INCLUDING INTEGRATED PASSIVE COMPONENTS

FIELD OF THE INVENTION

The present invention is related in general to the field of semiconductor devices and processes, and more specifically to low profile, vertically integrated package-on-package semiconductor systems, which incorporate portions of the assembly board.

DESCRIPTION OF THE RELATED ART

Electronic products have, at their core, printed circuit boards, which assemble and interconnect the semiconductor devices, passive components, control devices, power supplies, and display devices, which are needed in the particular product. Today, an increasing number of these electronic products, such as hand-held wireless telephones, electronic cameras, and portable computers, are subjected to market trends, which require an on-going shrinking of the product outlines and weight, and for which, therefore, the size, space, and weight required by the boards are at a premium. Other applications requiring shrinking board space are the controls and sensors in automobiles, airplanes and rockets.

In order to shrink board outlines, present technology focuses on reducing the board area consumed by each individual part assembled on a board; for instance, concerted efforts are expended to shrink the package of the semiconductor devices and passive components. Unfortunately, progress in this effort is only gradual and slow.

SUMMARY OF THE INVENTION

Applicant recognizes the need for a step function progress in reducing board outlines. In Applicants' approach, significantly smaller board areas can be achieved by selecting a number of passive electronic components from the board, assembling these components onto a special substrate, and stacking this newly formed sub-system onto the package of an active semiconductor device. In other words, the valuable two-dimensional area of the board is reduced by adding the freed-up components to the third dimension of the system.

Applicants further recognize that this package-on-package method offers improved speed and power capabilities by minimizing electrical resistances and inductances, and replacing ire bonding with flip-chip assembly. It may also offer reduced manufacturing time and improved product reliability.

One embodiment of the invention is a semiconductor system which has a packaged active device including a substrate with electrical contact pads and a semiconductor chip with active electrical components assembled on the substrate. The system further has a packaged passive subsystem including a substrate with electrical contacts, and passive electrical components, such as resistors, capacitors, and inductors, assembled on the substrate. Metal reflow bodies, such as solder balls, connect the active device stacked with the passive subsystem.

Another embodiment of the invention is a semiconductor system, which has a packaged active subsystem including a substrate with electrical contact pads and two or more semiconductor chips stacked on top of each other, the stack assembled on the substrate. The system further has a packaged subsystem of passive electrical components; this subsystem is stacked with the active subsystem and connected to it by reflow bodies.

Another embodiment of the invention is a semiconductor system, which has two or more packaged subsystems; each subsystem has two or more semiconductor chips stacked on top of each other assembled on a substrate. The system further has a packaged subsystem of passive electrical components; this subsystem is stacked on top of the stack of active subsystems and connected to them by reflow bodies.

It is a technical advantage of the invention that the involvement of the third dimension offers the possibility to add another active device, or another passive device, to the stack. The invention is flexible with regard to the type, number and interconnection of the chips and passive components. When wire bonding is used for interconnection, it is advantageous to employ protective encapsulation material to cover at least a portion of the chips or the passive components, leaving those substrate contact pads uncovered, which are needed for reflow interconnections between stacked devices.

The resulting system of stacked semiconductor devices lends itself to minimization not only of the assembly area required for the system, but also of the overall system thickness. The latter goal can be accomplished by using devices with partial cavity substrates and/or partial component encapsulation.

Another embodiment of the invention is a method for fabricating a semiconductor system, which includes the fabrication of a packaged first and a packaged second active subsystem and the fabrication of a packaged integrated passive subsystem.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
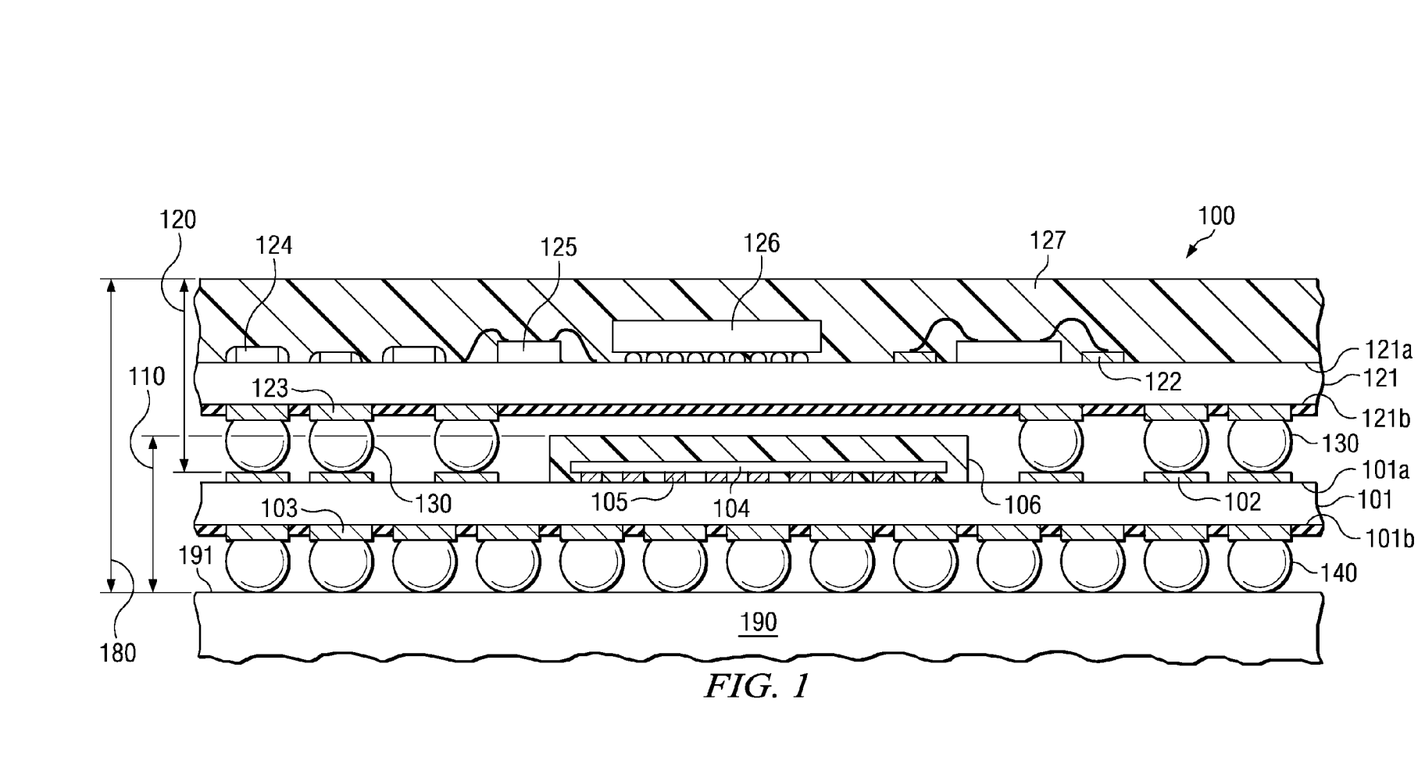
FIG. 1 illustrates a schematic cross section of a system including two subsystems connected by solder bodies; one subsystem has an active semiconductor chip assembled on a substrate, the other subsystem has passive electrical components assembled on a substrate.

FIG. 1 is an example of an embodiment of the present invention, illustrating a vertically integrated, low profile semiconductor system, generally designated 100, composed of an integrated active device 110 and an integrated passive device 120; the system is intended for connection to external parts such as a printed circuit board 190.

In FIG. 1, the integrated active device 110 has a substrate 101, made of an insulating body with a first surface 101a and a second surface 101b, electrical contact pads 102 on the first surface and electrical contact pads 103 on the second surface. Preferred materials for substrate 101 are ceramics or polymers in a sheet-like configuration; the polymers may be stiff or compliant. The substrates have a thickness in the range from about 50 to 500 μm. The contact pads are preferably made of copper with a surface metallurgically suitable for attaching reflow metals such as solder; examples are surfaces with a thin layer of gold or palladium. In addition, substrate 101 may have conductive lines on the surface 101a and 101b, conductive lines between the surfaces, and conductive vias extending from surface 101a to surface 101b; these lines and vias are not shown in FIG. 1.

As defined herein, the term reflow metals refers to metals or alloys, which melt at temperatures between about 150 and 320° C.; examples are solders made of tin or various tin alloys (containing silver, copper, bismuth, or lead). In contrast, the term non-reflow metals refer to metals or alloys, which melt at temperatures between about 900 and 1200° C.; examples are silver, gold, and copper.

Active device 110 further has a first semiconductor chip 104 on the first surface 101a. In the example of FIG. 1, chip 104 is attached to substrate 101 by the flip-chip technique and is electrically connected to contacts on surface 101a by reflow or non-reflow metal studs 105. Alternatively, it could be attached to surface 101a using an adhesive polymer and electrically connected to contact pads by wire bonding.

Device 110 may further include encapsulation material 106, such as an epoxy-based molding compound, to cover the first chip and the electrical connections between first chip 104 and first substrate surface 101a. The encapsulation material, however, does not cover contact pads 102. Such encapsulation is preferred for wire-bonded chips 104, but would not be required for flip-chip connected chips as in FIG. 1; consequently, it is shown in dashed outlines in FIG. 1.

The integrated passive device 120 in FIG. 1 has a substrate 121, made of an insulating body with a third surface 121a and a fourth surface 121b, electrical contact pads 122 on the third surface and electrical contact pads 123 on the fourth surface. Preferred materials for substrate 121 are ceramics or polymers in a sheet-like configuration; the polymers may be stiff or compliant. The substrates have a thickness in the range from about 50 to 500 μm. The contact pads are preferably made of copper with a surface metallurgically suitable for attaching reflow metals such as solder; examples are surfaces with a thin layer of gold or palladium. In addition, substrate 121 may have conductive lines on the surface 121a and 121b, conductive lines between the surfaces, and conductive vias extending from surface 121a to surface 121b; these lines and vias are not shown in FIG. 1.

Passive device 120 further includes a plurality of passive electrical components assembled on the third surface. In the example of FIG. 1, an assortment of capacitors 124, resistors 125, and inductors 126 is displayed. These components may be attached to surface 121a by adhesives, by flip-technology, or by wire bonding. In conventional technology, these passive components are assembled on board surface 191, where they consume valuable real estate and thus hinder the progressive miniaturization. In FIG. 1, the components have been collected from the board surface 191 and assembled on substrate surface 121a in order to free up board area and rather utilize the "third dimension" by stacking device 120 on top of device 110.

Device 120 may also have encapsulation material 127 to cover at least a portion of the passive components, especially the wire bond connections the third surface.

System 100 further includes metal reflow bodies 130, which have a first reflow temperature; examples are tin/lead alloy solder balls with a melting temperature of approximately 300° C. Reflow bodies 130 connect contact pads 102 on the first surface with contact pads 123 on the fourth surface.

The attachment of system 100 to board 190 is accomplished by metal reflow bodies 140 on contact pads 103 of second surface 101b. Reflow bodies 140 have a second reflow temperature, which is lower than the first reflow temperature of bodies 130. Examples are tin, tin alloys containing silver, copper, or bismuth, or eutectic tin/lead alloy, with a melting temperature of about 170 to 220° C.

As mentioned, the thicknesses of the first and the second substrate are preferably between 0.05 and 0.5 mm; the thickness of each semiconductor chip is in the 0.1 to 0.3 mm range. The total thickness 180 of system 100 depends on assembly features such as wire bonding, flip-chip assembly, encapsulation compounds, solder ball diameter, etc. Thickness 180 can be kept small, when no wire bonding and no encapsulation material has to be used. With the appropriate selection of techniques, overall thickness 180 of system 100 is between about 1.0 and 1.8 mm, and is preferably about 1.6 mm.

Figure 2:
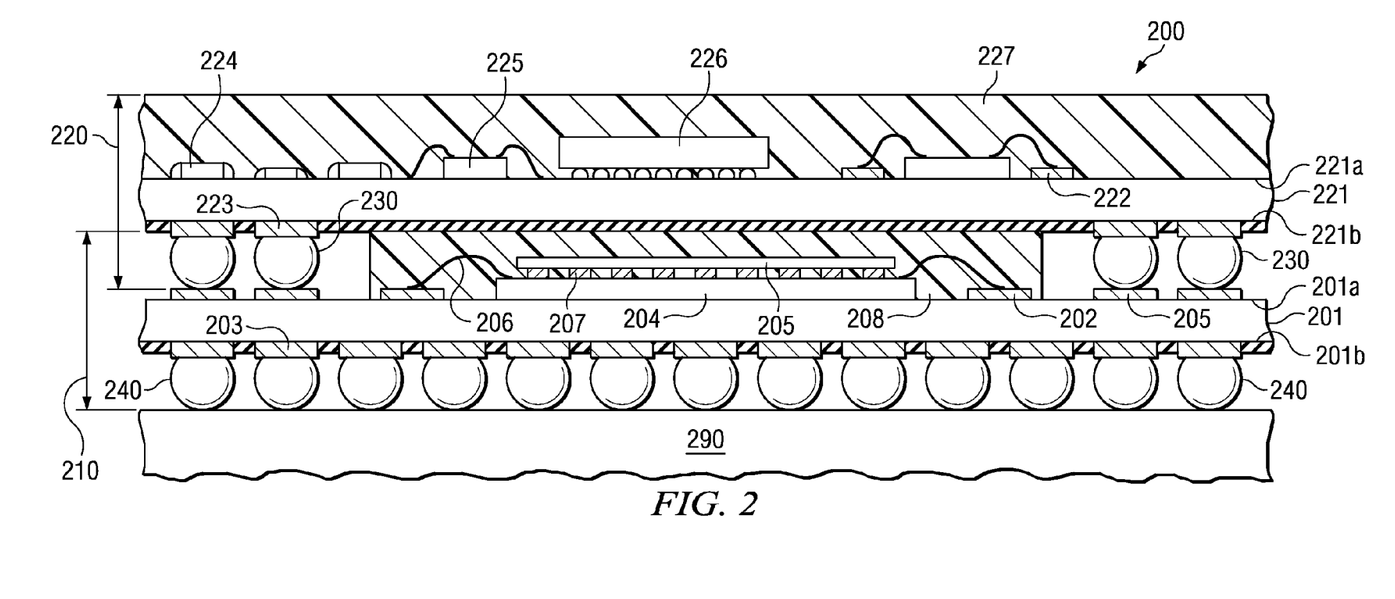
FIG. 2 is a schematic cross section of another system including two subsystems connected by solder bodies; one subsystem has a stack of active semiconductor chips assembled on a substrate, the second subsystem has passive electrical components assembled on a substrate.

Chip 104 may actually be a stack of two or more chips. FIG. 2 illustrates an embodiment of a semiconductor system 200 composed of an active subsystem 210 and a passive subsystem 220. Active subsystem 210 includes a stack of semiconductor chips 204 and 205. A second semiconductor chip 205 is stacked with the first chip 204 by flip technique (studs 207). Generally, one chip of the stack is attached to the first surface 201a of substrate 201, and one chip is electrically connected to contact pads 202 on the first surface 201a. In FIG. 2, the electrical connection is performed by bonding wires 206. Consequently, for protecting the chips and the electrical wire connections, the chip stack is covered with encapsulation material 208, preferably an epoxy-based molding compound.

The passive subsystem 220 in FIG. 2 is similar to the passive device of FIG. 1. Subsystem 220 has a substrate 221, made of an insulating body with electrical contact pads 222 and 223. A plurality of passive electrical components is assembled on substrate 221: Capacitors 224, resistors 225, and inductors 226. These components may be attached to the substrate by adhesives, by flip-technology, or by wire bonding. While these passive components are assembled, in conventional technology, on the surface of a circuit board 290 or another external part, where they consume valuable real estate, they are transferred, according to the invention, as a passive subsystem to the third dimension and stacked with active subsystems.

Some of the passive components of FIG. 2 are electrically connected by wire bonding. In is, therefore, preferred to encapsulate the components and their electrical connections in a molding compound 227.

The electrical connection between active subsystem 210 and passive subsystem 220 is performed by metal reflow bodies 230, which have a first reflow temperature; examples are tin/lead alloy solder balls with a melting temperature of about 300° C. The electrical connection between system 200 and external board 290 is performed by metal reflow bodies 240, which have a second reflow temperature lower than the first reflow temperature of bodies 230. Examples are tin or tin alloys with bismuth, silver, or copper, tin/lead eutectic alloy, with a melting temperature in the range between about 170 to 220° C.

Figure 3:
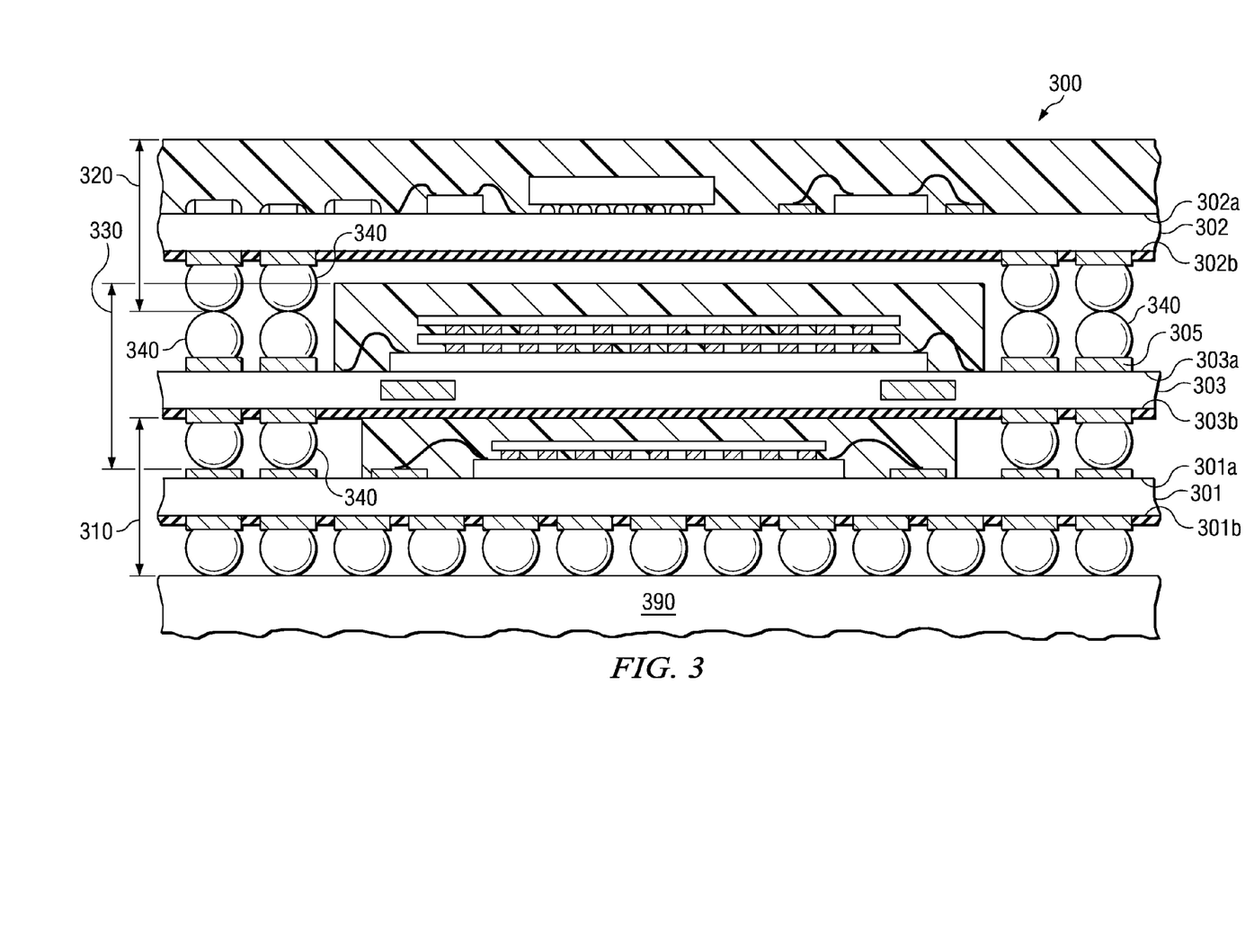
FIG. 3 is a schematic cross section of another system including three subsystems connected by solder bodies; two subsystems have a stack of active semiconductor chips assembled on a substrate, the third subsystem has passive electrical components assembled on a substrate.

The package-on-package concept of the invention allows the addition of more subsystems, active and/or passive subsystems, to the semiconductor system. An example of stacking an additional active subsystem is illustrated in FIG. 3. The semiconductor system 300 includes first active subsystem 310, passive subsystem 320, and, sandwiched between subsystems 310 and 320, a second active subsystem 330.

First active subsystem has a first substrate 301 with first surface 301a and second surface 301b; the passive subsystem 320 has a second substrate 302 with third surface 302a and fourth surface 302b; and the second active subsystem 330 has a third substrate 303 with fifth surface 303a and sixth surface 303b. The substrates are made of sheet-like 50 to 500 μm thick insulating bodies such as a ceramic or a polymer, which are integral with conductive lines, conductive surface-to-surface vias, and electrical contact pads on all substrate surfaces.

In the example of FIG. 3, the second active subsystem 330 contains a stack of three semiconductor chips with active electrical components. The stack is formed by flip-chip assembly and attached to surface 303a of substrate 303; the electrical connection to surface 303a is accomplished by wire bonding. Consequently, the chip stack is encapsulated, preferably in protective molding compound. The encapsulation, though, covers only a portion of surface 303a in order to leave those contact pads 305 uncovered, which are needed for metal reflow interconnection between the subsystems.

Metal reflow bodies 340 electrically interconnect subsystems 310, 320, and 330. Reflow bodies 340 preferably are alloys with the first reflow temperature of approximately 300° C.; examples are tin/lead alloys. FIG. 3 illustrates interconnections, for which the diameter of just one solder body is sufficient to connect two facing contact pads of two subsystems, as well as other interconnections, for which the diameters of two solder bodies are needed to establish the interconnection between facing contact pads. As FIG. 3 indicates, the difference is created by the thickness of the subsystem chip encapsulation: the second active subsystem 330 contains a stack of three semiconductor chips assembled on the fifth substrate surface 303a. The resulting thickness of subsystem 330 requires one solder body each on surface 303a and on surface 302b in order to bridge the distance between subsystems 330 and 320.

Figure 4:
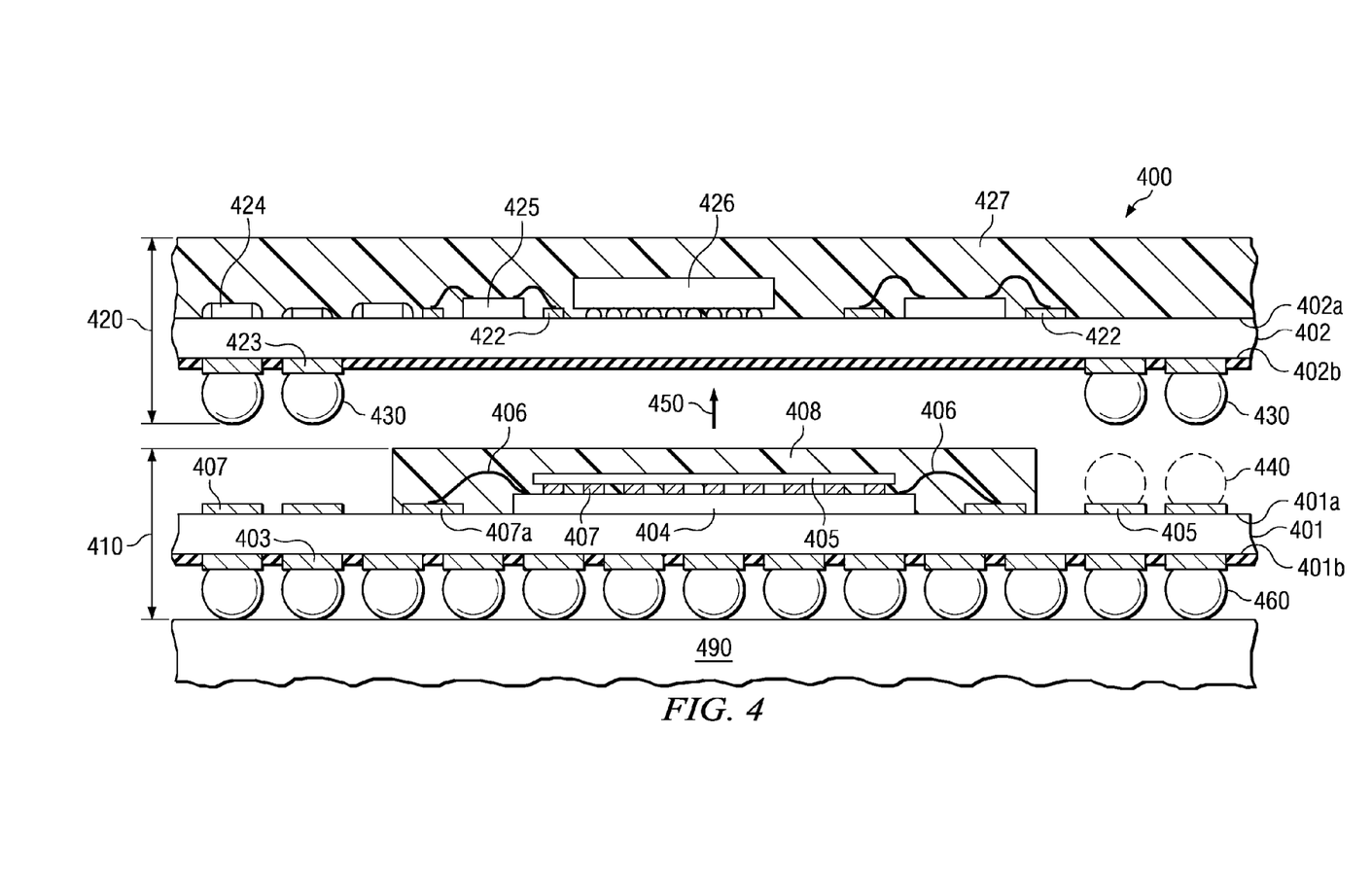
FIG. 4 depicts schematic cross sections to illustrate the process of fabricating a system including two substrate strips of packaged subsystems. One subsystem has a stack of active semiconductor chips assembled on the substrate, the other subsystem has passive electrical components assembled on the substrate.
Figure 5:
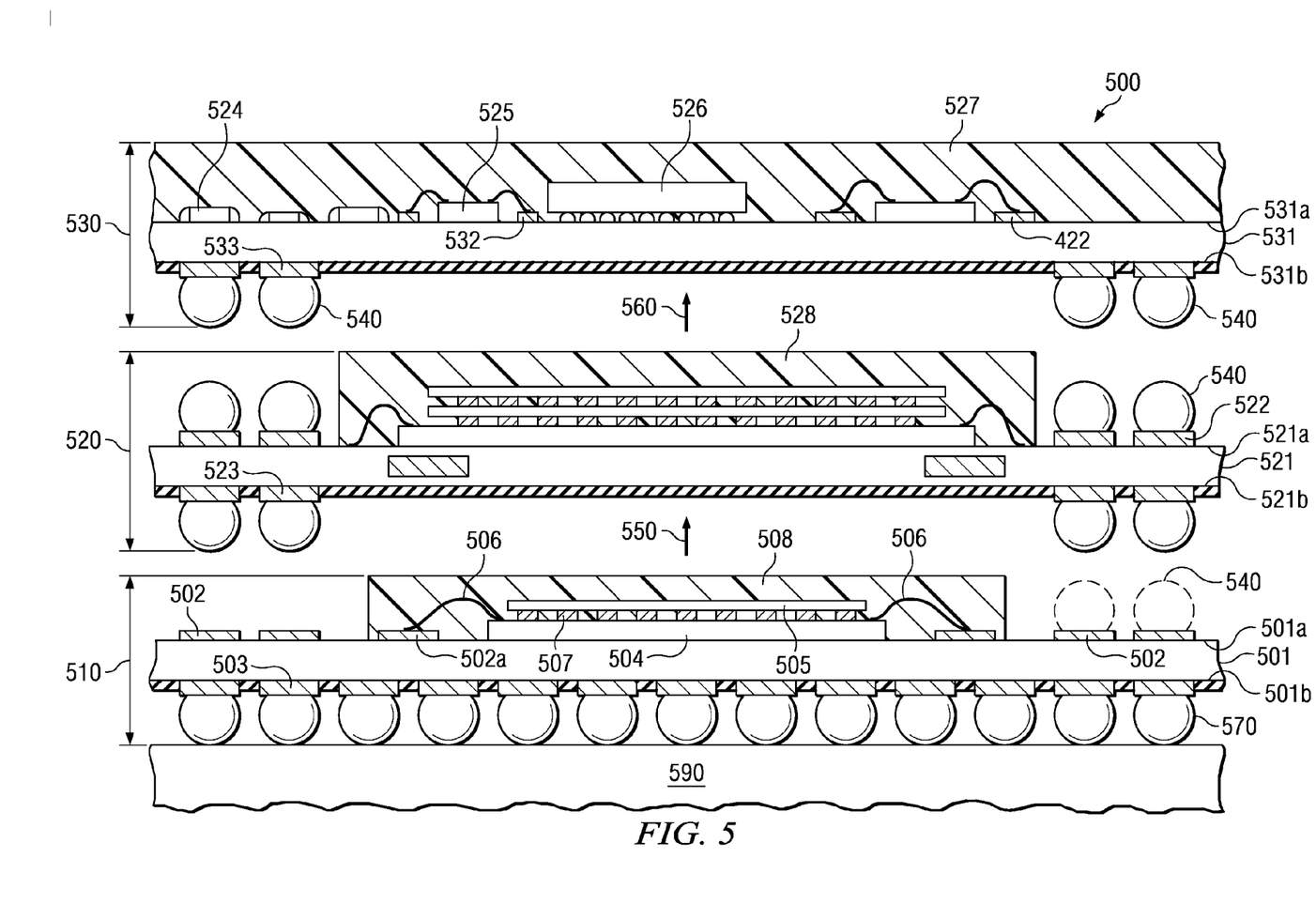
FIG. 5 shows schematic cross sections to illustrate the process of fabricating another system including three substrate strips of packaged subsystems. Two subsystems have a stack of active semiconductor chips assembled on their substrate, the third subsystem has passive electrical components assembled on its substrate.

Another embodiment of the invention is a method for fabricating a semiconductor system; the method includes the steps of fabricating two packaged subsystems of specific design features, aligning the subsystems, and joining them by reflowing connection members. FIGS. 4 and 5 illustrate embodiments of subsystems, and the process of joining the subsystems, and FIGS. 2, and 3 depict the finished systems.

The process of fabricating the packaged first active subsystem, designated 410 in FIG. 4, starts by providing a first strip 401 of an electrically insulating sheet-like body (ceramic, polymer, etc.) with a first (401a) and a second (401b) surface. Integral with the body are a plurality of electrically conducting paths (preferably copper-filled vias) from the first to the second surface, and a plurality of electrically conducting lines (preferably patterned copper layers), which extend in x-y directions of the sheet-like strip (paths and lines, and the area of the chips, are not shown in FIG. 4). Next, electrical contact pads 402, 402a, and 403 on the first and the second surface, respectively, are formed; preferably, they are input/output terminals for the paths and are made of copper with a metallurgical surface amenable to solder attachment and wire bonding (preferably by a thin layer of gold or palladium). Contact pads 402 on first surface 401a have predetermined locations, which are designed to match the pad locations of the passive subsystem 420 intended to be interconnected with active subsystem 410.

First stacks of semiconductor chips with bond pads are provided. While for some products, the stack may only contain one chip, in many products there are two or more chips in the stack; as an example, FIG. 4 shows two chips 404 and 405 in a first stack. In most embodiments, the chips are vertically aligned and attached by flip-chip technique or by an adhesive layer to form a stack.

One chip (for instance, 404) of the first stacks of semiconductor chips is assembled on substrate 401 using an adhesive layer, or alternatively by flip-attachment. The bond pads of the attached chip 404 may then electrically be connected to contact pads 402a on the first surface 401a using wire bonding. The other chip 405 of the first stack is attached to (the active surface of) chip 404 by a flip-chip technique so that both chips face each other with their active surfaces. Alternatively, 405 may be attached to chip 404 by an adhesive film and then electrically connected by wire bonding.

In the next process step, the assembled first chip stacks and their electrical connections are encapsulated, preferably in a molding compound 408 by submitting strip 401 to a transfer molding process. The encapsulation step, however, leaves contact pads 402 on first strip surface 401a uncovered. When required by the height of encapsulation 408, the next process step includes the attachment of first metal reflow bodies 440 (preferably a tin/lead alloy) to the contact pads 402; in FIG. 4, reflow bodies 440 are shown in dashed outline, because the height of encapsulation 408 may not require them. For the attachment, a first reflow temperature $T_1$, is used.

Next, the process of fabricating the packaged second subsystem, designated 420 in FIG. 4, starts by providing a second strip 402 of an electrically insulating sheet-like body (ceramic, polymer, etc.) with a third (402a) and a fourth (402b) surface. Integral with the body are a plurality of electrically conducting paths (preferably copper-filled vias) from the third to the fourth surface, and a plurality of electrically conducting lines (preferably patterned copper layers), which extend in x-y directions of the sheet-like strip (paths and lines, and the area of the chips, are not shown in FIG. 4).

Next, electrical contact pads 422 on the third surface are formed, concurrently with contact pads 423 on the fourth surface. The locations of pads 423 on fourth surface 402b match the pad locations 402 on the first substrate surface 401a of subsystem 410. Preferably, these contact pads are input/output terminals for the paths and are made of copper with a metallurgical surface amenable to wire bonding and solder attachment.

Next, passive electrical components are provided. In the example of FIG. 4, these passive components include capacitors 424, resistors 425, and inductors 426. The components may be attached to surface 402a by adhesives and electrically connected by wire bonding, or they may be attached and connected by flip-technology.

In the next process step, at least portions of the assembled passive components and their electrical connections are encapsulated, preferably in a molding compound 427 by submitting strip 420 to a transfer molding process. Compound 427 is selected to withstand the first reflow temperature $T_1$ of metal reflow bodies 430. Thereafter, first metal reflow bodies 430, preferably tin/lead alloys, are attached to contact pads 423, using first reflow temperature $T_1$.

In the next process step, strip 410 and strip 420 are aligned so that first metal reflow bodies 430 contact the contact pads 402 on the first surface 401a. This movement step is indicated in FIG. 4 by arrow 450.

Thermal energy is then applied to raise the temperature of the aligned system to $T_1$, causing the first reflow bodies 430 to melt and connect to contact pads 402. After cooling to ambient temperature, the strips 410 and 420 are connected.

Second reflow bodies 460 with a second reflow temperature $T_2$ are then selected so that $T_2$ is lower than the first reflow temperature $T_1$ employed for attaching first metal reflow bodies 430. Suitable metals and alloys include tin and tin alloys containing silver, copper, bismuth, or lead (in the eutectic mixture). Second reflow bodies 460 are attached to the contact pads 403 on the second surface 401b.

Finally, the assembled strips 410 and 420 are simulated (preferably by sawing) into individual packaged semiconductor systems, illustrated as system 200 in FIG. 2, containing a subsystem 410 connected to a subsystem 420.

Another embodiment of the invention is a method for fabricating a semiconductor system including the steps of fabricating three or more packaged subsystems of specific design features, aligning the subsystems, and joining them by reflowing connection members. As an example, FIG. 5 illustrates the assembly of three subsystems: Two subsystems 510 and 520 are active semiconductor subsystems; each contains a stack of two or more active semiconductor chips. The third subsystem 530 is a passive subsystem; it includes a plurality of passive electrical components.

The process of fabricating the packaged first active subsystem 510 is analogous to the process above for the fabrication of subsystem 410 in FIG. 4. It starts by providing a first strip 501 of an electrically insulating sheet-like body and forming electrical contact pads 502, 502a, and 503 on the first and the second substrate surface, respectively. The pads have a solderable and bondable metallurgical surface. The locations of contact pads 502 are selected so that the match the pad locations 523 of the second active subsystem 520 intended to be interconnected with the first active subsystem 510.

First stacks of semiconductor chips with active electrical components and bond pads are provided. They are assembled on the first substrate surface. In the next process step, the assembled first chip stacks and their electrical connections are encapsulated using compound 508; however, contact pads 502 on first strip surface remain uncovered. When required by the height of encapsulation 508, the next process step includes the attachment of first metal reflow bodies 540 (preferably a tin/lead alloy) to the contact pads 502 using first reflow temperature $T_1$.

The process of fabricating the packaged second active subsystem 520 is similar to the process above for the fabrication of the first active subsystem 510. It starts by providing a second strip 521 of an electrically insulating sheet-like body and forming electrical contact pads 522 and 523 on the third and the fourth substrate surface, respectively. The pads have a solderable and bondable metallurgical surface. The locations of contact pads 522 are selected so that the match the pad locations 533 of the passive subsystem 530 intended to be interconnected with the second active subsystem 520. The locations of contact pads 523 match the locations of contact pads 502 of the first active subsystem 510.

Second stacks of semiconductor chips with active electrical components and bond pads are provided. They are assembled on the third substrate surface. In the next process step, the assembled second chip stacks and their electrical connections are encapsulated using compound 528; however, contact pads 522 on the third strip surface remain uncovered.

The next process step includes the attachment of first metal reflow bodies 540 (preferably a tin/lead alloy) to the contact pads 523 using first reflow temperature $T_1$; when required by the height of encapsulation 528, reflow bodies 540 are concurrently attached to the contact pads 522.

Next, the process of fabricating the packaged third subsystem, designated 530 in FIG. 5, starts by providing a third strip 531 of an electrically insulating sheet-like body and forming electrical contact pads 532 and 533 on the fifth and sixth substrate surface, respectively. The pads have a solderable and bondable metallurgical surface. The locations of contact pads 533 are selected so that they match the pad locations 522 of the second active subsystem 520 intended to be interconnected with the passive subsystem 530.

Next, passive electrical components are provided. The components may be attached to substrate 530 by adhesives and electrically connected by wire bonding, or they may be attached and connected by flip-technology.

In the next process step, at least portions of the assembled passive components and their electrical connections are encapsulated. Thereafter, first metal reflow bodies 540, preferably tin/lead alloys, are attached to contact pads 533, using first reflow temperature $T_1$.

In the next process step, the second substrate strip 520 is aligned with the first substrate strip 510 so that the reflow bodies on pads 523 of the second strip contact the pads 502 (or the reflow bodies 540 on pads 502) of the first substrate strip. This movement step is indicated in FIG. 5 by arrow 550.

Third substrate strip 530 is then aligned with the second substrate strip 520 so that the reflow bodies on pads 533 of the third strip contact pads 522 (or the reflow bodies 540 on pads 522) of the second substrate strip. This movement step is indicated in FIG. 5 by arrow 560.

Thermal energy is then applied to raise the temperature of the aligned systems to $T_1$, causing all first reflow bodies 540 to melt and connect to their respective contact pads. After cooling to ambient temperature, the strips 510 and 520 are connected, and the strips 520 and 530 are connected.

Second reflow bodies 570 with a second reflow temperature $T_2$ are then selected so that $T_2$ is lower than the first reflow temperature $T_1$ employed for attaching first metal reflow bodies 540. Suitable metals and alloys include tin and tin alloys containing silver, copper, bismuth, or lead (in the eutectic mixture). Second reflow bodies 570 are attached to the contact pads 503 of the first strip 510.

Finally, the assembled strips 510, 520, and 530 are simulated (preferably by sawing) into individual packaged semiconductor systems, illustrated as system 300 in FIG. 3, containing the subsystem 510 connected to subsystem 520 connected to subsystem 530.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the process steps of encapsulating can be omitted when the integration of the system has been achieved by flip-chip assembly.

It is therefore intended that the appended claims encompass any such modifications or embodiment.

We claim:

1. A semiconductor system comprising:
    a first active device including:
        a first substrate having a first and a second surface, and electrical contact pads on the first and the second surface; and
        a first semiconductor chip having active electrical components;
    an integrated passive device including:
        a second substrate having a third and a fourth surface, and electrical contact pads on the third and the fourth surface; and
    passive electrical components assembled on the third surface; and
    first metal reflow bodies, having a first reflow temperature, electrically connecting the contact pads on the first and the fourth surface to electrically connect; and second metal reflow bodies attached to the contact pads on the second substrate surface, the second reflow bodies having a second reflow temperature lower than the first reflow temperature.

2. The system according to claim 1 further including encapsulation material covering the semiconductor chips and their assembly connections to the first substrate surface.

3. The system according to claim 1 further including encapsulation material covering the passive electrical components and their assembly connections to the third substrate surface.

4. The system according to claim 1 wherein the passive electrical components include resistors, capacitors, and inductors.

5. The system according to claim 1 further including a second semiconductor chip stacked with the first chip so that one chip of the stack is attached to the first substrate surface, and the other chip electrically connected to contact pads on the first substrate surface.

6. The system according to claim 1 further including a second active device inserted between the first active device and the passive device, the second active device having:
    a third substrate with a fifth and a sixth surface, and electrical contact pads on the fifth and the sixth surface;
    metal reflow bodies attached to the contact pads so that the bodies on the fifth surface electrically connect to the pads on the fourth surface, and the bodies on the sixth surface electrically connect to the pads on the first surface, the reflow bodies having the first reflow temperature; and
    a semiconductor chip, or a stack of semiconductor chips, having active electrical components assembled on the fifth surface.

7. A method for fabricating a semiconductor system comprising the steps of:
    fabricating a packaged first active subsystem including the steps of:
        providing a first strip of electrically insulating sheet-like substrate having a first and a second surface;
        forming electrical contact pads on the first and the second surface at pad locations;
        providing first stacks of semiconductor chips having active electrical components; and assembling the chip stacks on the first surface;
    fabricating a packaged integrated passive subsystem including the steps of:
        providing a second strip of electrically insulating sheet-like substrate having a third and a fourth surface;
        forming electrical contact pads on the third and the fourth surface, the pads on the fourth surface matching the pad locations on the first substrate surface;
        providing passive electrical components; assembling the passive components on the third substrate surface; and
        attaching first metal reflow bodies having a first reflow temperature to the contact pads on the fourth substrate surface;
    aligning and contacting the reflow bodies on the fourth strip surface with the contact pads on the first strip surface;
    reflowing the reflow bodies using the first reflow temperature to electrically connect the first and the second strip;
    attaching second metal reflow bodies having a second reflow temperature lower than the first reflow temperature, to the contact pads on the second surface; and
    singulating the assembled strips into individual packaged semiconductor systems.

8. The method according to claim 7 further including the step of covering the chip stacks, their assembly connections, and portions of the first substrate surface with encapsulation material, leaving selected contact pads with locations on the first substrate surface uncovered, after the step of assembling the chip stacks on the first surface.

9. The method according to claim 8 further including the step of attaching first reflow bodies having the first reflow temperature to the contact pads on the first surface, after the step of covering the chip stacks.

10. The method according to claim 7 further including the step of covering at least portions of the passive electrical components, their assembly connections, and at least portions of the third substrate surface with encapsulation material, after the step of assembling the passive components on the third surface.

11. A method for fabricating a semiconductor system comprising the steps of:
    fabricating a packaged first active subsystem including the steps of:
        providing a first strip of electrically insulating sheet-like substrate having a first and a second surface;
        forming electrical contact pads on the first and the second surface at pad locations;
        providing first stacks of semiconductor chips having active electrical components; and
    assembling the first chip stacks on the first surface;
    fabricating a packaged second active subsystem including the steps of:
        providing a second strip of electrically insulating sheet-like substrate having a third and a fourth surface;
        forming electrical contact pads on the third and the fourth surface, the pads on the third surface having locations, the pads on the fourth surface matching the pad locations on the first surface;
        providing second stacks of semiconductor chips having active electrical components;
        assembling the second chip stacks on the third surface; and attaching first metal reflow bodies having a first reflow temperature to the contact pads on the fourth substrate surface;

fabricating a packaged integrated passive subsystem including the steps of:

providing a third strip of electrically insulating sheet-like substrate having a fifth and a sixth surface;

forming electrical contact pads on the fifth and the sixth surface, the pads on the sixth surface matching the pad locations on the third surface;

providing passive electrical components;

assembling the passive components on the fifth surface; and attaching first metal reflow bodies having the first reflow temperature to the contact pads on the sixth surface;

aligning the second substrate strip with the first substrate strip, contacting the reflow bodies on the fourth surface with the contact pads on the first surface;

aligning the third substrate strip with the second substrate strip, contacting the reflow bodies on the sixth surface with the contact pads on the third surface;

reflowing the first reflow bodies using the first reflow temperature, thereby electrically connecting the second active subsystem with the first active subsystem and the passive subsystem with the second active subsystem;

attaching second metal reflow bodies having a second reflow temperature lower than the first reflow temperature, to the contact pads on the second surface; and singulating the assembled strips into individual packaged semiconductor systems.

12. The method according to claim 11 further including, after the step of assembling the first chip stacks, the step of covering the chip stacks, their assembly connections, and portions of the first substrate surface with encapsulation material, leaving selected contact pads located on the first substrate surface uncovered.

13. The method according to claim 12 further including, after the step of covering the first chip stacks, the step of attaching reflow bodies having the first reflow temperature to the contact pads on the first surface.

14. The method according to claim 11 further including, after the step of assembling the second chip stacks, the step of covering the chip stacks, their assembly connections, and portions of the third substrate surface with encapsulation material, leaving selected contact pads located on the third substrate surface uncovered.

15. The method according to claim 11 further including, concurrent with the step of attaching reflow bodies to the contact pads on the fourth surface, the step of attaching reflow bodies having the first reflow temperature to the contact pads of the third surface.

16. The method according to claim 11 further including the step of covering at least portions of the passive electrical components, their assembly connections, and at least portions of the fifth substrate surface with encapsulation material.

* * * * *